(12) United States Patent
Lani et al.

(10) Patent No.: US 12,091,314 B2
(45) Date of Patent: Sep. 17, 2024

(54) COMPOSITE TIMEPIECE AND METHOD FOR PRODUCING SAME

(71) Applicant: CSEM CENTRE SUISSE D'ELECTRONIQUE ET DE MICROTECHNIQUE SA—RECHERCHE ET DÉVELOPPEMENT, Neuchâtel (CH)

(72) Inventors: Sébastien Lani, Courtepin (CH); Raphaël Pugin, Colombier (CH)

(73) Assignee: CSEM Centre Suisse d'Electronique et de Microtechnique SA—Recherche et Développement, Neuchâtel (CH)

( * ) Notice: Subject to any disclaimer, the term of this patent is extended or adjusted under 35 U.S.C. 154(b) by 271 days.

(21) Appl. No.: 16/061,310

(22) PCT Filed: Oct. 11, 2016

(86) PCT No.: PCT/EP2016/074316
§ 371 (c)(1),
(2) Date: Jun. 11, 2018

(87) PCT Pub. No.: WO2016/203063
PCT Pub. Date: Dec. 22, 2016

(65) Prior Publication Data
US 2018/0361472 A1    Dec. 20, 2018

(30) Foreign Application Priority Data

Dec. 15, 2015    (EP) ..................................... 15200204

(51) Int. Cl.
*B81C 1/00*       (2006.01)
*B22F 7/08*       (2006.01)
(Continued)

(52) U.S. Cl.
CPC ............ *B81C 1/00373* (2013.01); *B22F 7/08* (2013.01); *B22F 10/10* (2021.01); *B22F 10/28* (2021.01);
(Continued)

(58) Field of Classification Search
CPC .......... B22F 3/008; B22F 7/08; B22F 3/1055; B22F 2202/11; B22F 2301/052;
(Continued)

(56) References Cited

U.S. PATENT DOCUMENTS 4,019,188 A * 4/1977 Hochberg ................ B41J 2/215
                                                        347/83
9,436,162 B2    9/2016 Klinger et al.
(Continued)

FOREIGN PATENT DOCUMENTS

CH          708736 A1 *  4/2015 ........... G04B 17/063
EP        1 172 714 A1    1/2002
(Continued)

OTHER PUBLICATIONS

Mohammad Vaezi, Srisit Chianrabutra, Brian Mellor & Shoufeng Yang (2013) Multiple material additive manufacturing—Part 1: a review, Virtual and Physical Prototyping, 8:1, 19-50, DOI: 10.1080/17452759.2013.778175 (Year: 2013).*
(Continued)

*Primary Examiner* — Rebecca Janssen
(74) *Attorney, Agent, or Firm* — Christensen O'Connor Johnson Kindness PLLC

(57) ABSTRACT

The present invention relates to a method for producing a timepiece comprising at least one first part produced by a microfabrication or microforming method in at least one first material, said method comprising at least: a step of depositing, on said first part, without moulding, at least one second part of said timepiece in at least one second material, and a
(Continued)

step of treating the second material in order to connect together the components on the first part.

9 Claims, 3 Drawing Sheets

(51) Int. Cl.

| | |
|---|---|
| *B22F 10/10* | (2021.01) |
| *B22F 10/28* | (2021.01) |
| *B22F 10/64* | (2021.01) |
| *B33Y 10/00* | (2015.01) |
| *B33Y 80/00* | (2015.01) |
| *C22C 1/04* | (2023.01) |
| *C22C 33/02* | (2006.01) |
| *G04B 13/02* | (2006.01) |
| *G04B 15/14* | (2006.01) |
| *G04B 17/06* | (2006.01) |
| *G04B 37/22* | (2006.01) |
| *G04B 45/00* | (2006.01) |
| *G04D 7/12* | (2006.01) |
| *B22F 10/39* | (2021.01) |

(52) U.S. Cl.
CPC ............... *B33Y 10/00* (2014.12); *B33Y 80/00* (2014.12); *C22C 1/0416* (2013.01); *C22C 1/0425* (2013.01); *C22C 1/0433* (2013.01); *C22C 1/0458* (2013.01); *C22C 1/0466* (2013.01); *C22C 33/02* (2013.01); *G04B 13/02* (2013.01); *G04B 15/14* (2013.01); *G04B 17/063* (2013.01); *G04B 37/22* (2013.01); *G04B 45/00* (2013.01); *G04D 7/1257* (2013.01); *B22F 10/39* (2021.01); *B22F 10/64* (2021.01); *B22F 2202/11* (2013.01); *B22F 2301/052* (2013.01); *B22F 2301/10* (2013.01); *B22F 2301/15* (2013.01); *B22F 2301/205* (2013.01); *B22F 2301/255* (2013.01); *B22F 2301/35* (2013.01); *B22F 2302/256* (2013.01); *B22F 2998/10* (2013.01); *B81B 2201/035* (2013.01); *B81C 2201/0184* (2013.01); *Y02P 10/25* (2015.11)

(58) Field of Classification Search
CPC ............... B22F 2301/10; B22F 2301/15; B22F 2301/205; B22F 2301/255; B22F 2301/35; B22F 2302/256; B22F 2998/10; C22C 33/02; C22C 1/0433; C22C 1/0425; C22C 1/0416; C22C 1/0458; C22C 1/0466; G04B 37/22; G04B 13/02; G04B 45/00; G04B 13/026; G04B 15/14; G04B 17/063; G04D 7/1257; B33Y 80/00; B33Y 10/00; B81C 1/00373; B81C 2201/0184; Y02P 10/25; B81B 2201/035

See application file for complete search history.

(56) References Cited

U.S. PATENT DOCUMENTS

| | | | |
|---|---|---|---|
| 10,585,399 B2 | 3/2020 | Issartel et al. | |
| 2010/0290319 A1* | 11/2010 | Swartz | G04D 3/00 |
| | | | 368/62 |
| 2012/0192424 A1 | 8/2012 | Cataldo et al. | |
| 2013/0272100 A1* | 10/2013 | Klinger | G04D 7/1292 |
| | | | 368/170 |
| 2013/0308430 A1* | 11/2013 | Verardo | G04D 7/10 |
| | | | 368/200 |
| 2016/0176126 A1* | 6/2016 | Kissling | B44C 1/22 |
| | | | 428/156 |

FOREIGN PATENT DOCUMENTS

| | | | | |
|---|---|---|---|---|
| EP | 1172714 A4 * | 4/2005 | ........... | G04B 17/063 |
| EP | 2 104 005 A1 | 9/2009 | | |
| EP | 2840059 A1 * | 2/2015 | ......... | B81C 1/00103 |
| JP | 2008151616 A | 7/2008 | | |
| JP | 2009216517 A | 9/2009 | | |
| JP | 2010038660 A | 2/2010 | | |
| JP | 2013542402 A | 11/2013 | | |
| JP | 2015049142 A | 3/2015 | | |
| JP | 2015161620 A | 9/2015 | | |
| WO | WO-2015010797 A1 * | 1/2015 | ............. | G04B 15/06 |
| WO | 2015/094005 A1 | 6/2015 | | |
| WO | 2015/150552 A1 | 10/2015 | | |

OTHER PUBLICATIONS

International Search Report mailed Sep. 11, 2016, issued in corresponding International Application No. PCT/EP2016/074316, filed Oct. 11, 2016, 5 pages.

Hybrid Lens CNC Machine. A Joint Project to Accelerate Industry Adoption of Metal Additive Manufacturing, www.optomec.com > wp-content > uploads > Apr. 2015, 28 pages.

Vaezi, M., et al., "Multiple material additive manufacturing—Part 1: a review," Virtual and Physical Prototyping 8(1):19-50, Mar. 2013.

Office Action mailed Apr. 2, 2021, issued in corresponding Japanese Application No. 2018-530785, 4 pages.

Office Action issued in counterpart Japanese Patent Application No. 2021-132501, mailed Jul. 26, 2022, 9 pages.

* cited by examiner

COMPOSITE TIMEPIECE AND METHOD FOR PRODUCING SAME

TECHNICAL FIELD

The present invention relates to a method for manufacturing a timepiece and/or a set of timepieces as well as a timepiece obtained according to said method.

More particularly, the present invention relates to a method for manufacturing a composite timepiece having two parts, a first part obtained from a first material such as silicon, and a second part obtained from a second material such as a metal for example.

BACKGROUND OF THE INVENTION

In the horology field, it is well known to make timepieces such as balance-springs, wheels or balances for example from silicon.

Indeed, silicon has many advantages, including its lightness, its resiliency, its non-magnetic nature and the possibility of being machined using micro-manufacturing techniques such as deep reactive ion etching (DRIE).

However, silicon also has several drawbacks. Silicon is fragile, brittle, since it does not have a plastic domain, making it difficult to fasten a silicon wheel on a staff, for example. Furthermore, the lightness of silicon, which is also an advantage, does not make it possible to make timepieces completely from silicon that must have a sufficient inertia or unbalance, such as a balance or an oscillating mass.

In order to resolve these drawbacks, so-called composite or hybrid timepieces have already been conceived having a first part made from silicon or the like and a second part made from metal, for example. This is in particular the case for patent applications WO 2008/135817, EP 2,060,534 and EP 2,104,005, for example.

Document EP 1,172,714 A1 also describes a method for adjusting the mass of a timepiece balance by localized ink projection using an inkjet device. This document does not, however, specify the nature of the inks used, which determines the application capacity and the precision thereof based on the materials. The printing distance of a system of the inkjet type is also greatly limited and not very compatible with use on timepieces integrated into a clockwork movement.

Document WO 2008/135817 describes a timepiece comprising a structure able to be made using a micro-manufacturing technique and at least one element formed in or on the periphery of the structure and from a material different from that of the structure to modify the mechanical properties of the component, for example to be used to increase the inertia/mass ratio of a balance or the unbalance/mass ratio of an oscillating mass, or to locally absorb part of the constraints generated by the driving of a staff, and to make the latter usable in a given application while preserving the advantages of the material used to produce the structure. More particularly, this document describes a method for manufacturing such a composite timepiece that is made from an oxidized silicon substrate having cavities filled by electrodeposition.

This type of method nevertheless has the drawback of requiring a step for producing a silicon cavity by producing a mold, which hinders the manufacturing cost of the timepieces. Thus, this type of method is not suitable for producing prototypes and/or small series of parts.

Document US 2004/0146650 A1 in turn describes a method for manufacturing micro-structured metal parts according to which three-dimensional structures are formed by electrochemical surface treatment of a part followed by a deposition of powders hot-pressed on the part to perform the hardening thereof. This hot isostatic pressing (HIP) manufacturing method has the drawback of requiring not only prior electrochemical treatment of the parts, but also a step for hot-pressing of the deposited powders to form the microstructures, which requires not only using molds, but is further extremely difficult, if not impossible, to implement on silicon parts due to the fragility thereof.

Document EP 2,060,534 describes a method for manufacturing a silicon-metal composite micromechanical part combining processes of the DRIE and LIGA type, according to the Germanic acronym "Röntgenlithographie, Galvanoformung, Abformung" (lithography, galvanization, forming). The invention also relates to a micromechanical part comprising a layer in which one part is made from silicon and another from metal in order to form a micromechanical part of the composite type. More particularly, the method comprises a step for selective chiseling of a cavity in an upper layer of a substrate to define a pattern of a silicon portion of the part, a step for sculpture of a cavity in an intermediate layer of the substrate, a step for growth of a metal layer from part of the cavities to form a metal part along the thickness of the component, and eliminating the micromechanical composite silicon/metal component of the substrate. The metal layer is developed by covering the top of the substrate with a photosensitive resin, then a photolithography method of the photosensitive resin according to the predetermined pattern of the metal part is executed selectively, and the photo-structured resin of the substrate is next removed.

This type of method requires carrying out a lithography step on a silicon substrate including fragile parts. Furthermore, this type of method includes a large number of steps that hinder the manufacturing cost of the timepieces, making it unsuitable for producing prototypes and/or small series of parts.

Document EP 2,104,005 describes a composite balance formed in a layer of a silicon-based material and including a hub connected to a felloe by at least one arm. The felloe has at least one additional part substantially in the form of a crenulated ring with a higher density than said silicon-based material making it possible to increase the inertia of said balance. The invention also relates to a method for manufacturing such a balance, said method consisting of equipping oneself with a substrate made from a silicon-based material, selectively depositing at least one layer of metal on the substrate to define the pattern of at least one metal part of said balance, the deposition being done by successive metal layers at least partially on the surface of the substrate, selectively etching at least one cavity in the substrate to define the pattern of the balance including said at least one layer of metal and freeing the balance from the substrate.

This type of method has the drawback of only allowing the production of silicon parts and not oxidized silicon, known under the name Silinvar (registered trademark), allowing thermal compensation. Furthermore, this type of method has the drawbacks induced by the lithography method, aside from the fact that it has a high risk of contamination of the DRIE etching chamber.

One of the aims of the invention is therefore to resolve these drawbacks by proposing a method for manufacturing a composite or hybrid timepiece, with a simple and inexpensive design, not including a lithography step, making it possible to produce prototypes and small series at low costs and having a reduced manufacturing duration relative to a LIGA-type method in particular.

BRIEF DESCRIPTION OF THE INVENTION

More specifically, the invention relates to a method for producing a timepiece comprising at least a first part made using a micro-manufacturing or micro-forming method from at least a first material, said method comprising at least:
a. a step for depositing, on said first part, without molding, at least a second part of said piece made from at least one second material, and
b. a step for treating the second material to connect the components to one another on the first part.

It will be understood that, unlike the methods of the prior art, the method according to the invention does not require a lithography step before depositing the second material, or a molding step for the added piece, or an assembly step, thereby limiting the manufacturing cost and making it possible to produce prototypes and/or small series at a low cost. The method according to the invention is further particularly efficient in terms of energy and respectful of the piece on which the second material is deposited, without molding, therefore without excessive mechanical stress of said piece and its first material, which makes its implementation suitable for deposition on fragile silicon pieces, for example.

According to a first embodiment, the method includes at least the following steps:
a. nebulizing an ink in the form of a solution or suspension of micrometric, submicronic or preferably nanometric particles of at least a second material,
b. spraying nebulized ink on the first part of the piece to form said second part, and
c. hardening said second part.

Said hardening step consists of a heat treatment that includes at least one annealing step and/or a localized sintering step.

Alternatively, said hardening step consists of a polymerization step by photo-cross-linking and/or chemical cross-linking.

This method corresponds to the so-called AJP (Aerosol Jet Printing) method, which makes it possible to deposit a very large number of materials, conductive materials to the dielectric materials by passing through the semiconductor or biological materials, on the micrometric scale, on planar pieces, but also flexible and three-dimensional pieces.

Preferably, the localized sintering step is obtained by radiation of the second part using a laser.

Furthermore, the polymerization step by photo-cross-linking may be obtained by ultraviolet projection on the second part.

According to a second embodiment, the method includes at least the following steps:
a. depositing a powder of at least a second material on the first part of the piece, and
b. localized laser sintering on said second part.

This method corresponds to the so-called LS (Laser Sintering) or SLS (Selective Laser Sintering) method, respectively, which makes it possible to use a very broad range of powders of different materials, including polymers, such as polyether ether ketone (PEEK) and PA12 nylons optionally associated with glass fiber, glass beads or aluminum powder, and/or metals such as steel, titanium, gold, etc. and alloys thereof.

Said second part forms either a decorative structure or a marking structure, or a functional element, such as an inertial mass or a so-called interfacing element or an organ intended to have a mechanical cooperation function with another piece.

Furthermore, the first part of the piece is obtained from silicon and/or metal and/or ceramic and/or plastic.

Furthermore, the second part of the piece may have a layer or a plurality of layers, each layer being obtained from a material.

Preferably, the second part of the piece, or each layer of said second part, is obtained from a material comprising silver (Ag) and/or aluminum (Al) and/or gold (Au) and/or titanium (Ti) and/or copper (Cu) and/or nickel (Ni) and/or platinum (Pt) and/or iron (Fe) and/or one of their oxides and/or at least one polymer.

Another object of the invention relates to a timepiece comprising at least a first part made by a micro-manufacturing or micro-forming method in at least one first material, remarkable in that it includes at least one second part obtained from at least one second porous material and deposited over all or part of said first part. It will be noted that, based on the method for manufacturing the second part according to the invention, the second part may have a microporosity or a mesoporosity or a macroporosity.

Preferably, the first part of the piece is obtained from silicon and/or metal and/or ceramic and/or plastic.

Furthermore, the second part of the piece may include a layer or a plurality of layers, each layer being obtained from a material.

Preferably, the second part of the piece, or each layer of said second part, is obtained from a material comprising silver (Ag) and/or aluminum (Al) and/or gold (Au) and/or titanium (Ti) and/or copper (Cu) and/or nickel (Ni) and/or platinum (Pt) and/or iron (Fe) and/or an oxide thereof and/or at least one polymer.

Another object of the invention relates to a timepiece comprising at least one first part made using a micro-manufacturing or micro-forming method from at least one first material, remarkable in that it includes at least one second part obtained from at least one second material made from micrometric, submicronic or preferably nanometric particles connected to one another and deposited over all or part of said first part.

In the same manner as before, the first part of the piece is preferably obtained from silicon and/or metal and/or ceramic and/or plastic.

Furthermore, the second part of the piece may have a layer or a plurality of layers, each layer being obtained from a material.

Preferably, the second part of the piece, or each layer of said second part, is obtained from a material comprising silver (Ag) and/or aluminum (Al) and/or gold (Au) and/or titanium (Ti) and/or copper (Cu) and/or nickel (Ni) and/or platinum (Pt) and/or iron (Fe) and/or an oxide thereof and/or at least one polymer.

A last object of the invention relates to a timepiece comprising at least a first part made from a micro-manufacturing or micro-forming method in at least one first material, remarkable in that it includes at least one second part obtained from at least one second porous material and deposited in successive layers over all or part of said first part such that said second part includes flanks forming an angle comprised between 10° and 89° with the surface on which it is deposited.

It will be observed that the deposition of the second part by successive layers, in the same material or in a different material, makes it possible to produce a second part with flanks inclined by an angle comprised between 10° and 89°, unlike the methods of the prior art that do not make it possible to produce pieces with straight flanks, i.e., having an angle of 90° with the surface of the first part. In this way, it is possible to improve the aerodynamics of the timepiece, but also to optimize the distribution of the masses of said part.

In the same manner as before, the first part of the piece is preferably obtained from silicon and/or metal and/or ceramic and/or plastic.

Furthermore, the second part of the piece may have a layer or a plurality of layers, each layer being obtained from a material.

Preferably, the second part of the piece, or each layer of said second part, is obtained from a material comprising silver (Ag) and/or aluminum (Al) and/or gold (Au) and/or titanium (Ti) and/or copper (Cu) and/or nickel (Ni) and/or platinum (Pt) and/or iron (Fe) and/or an oxide thereof and/or at least one polymer.

BRIEF DESCRIPTION OF THE DRAWINGS

Other details of the invention will appear more clearly upon reading the following description, done in reference to the appended drawing, in which.

DETAILED DESCRIPTION OF THE INVENTION

Figure 1A:
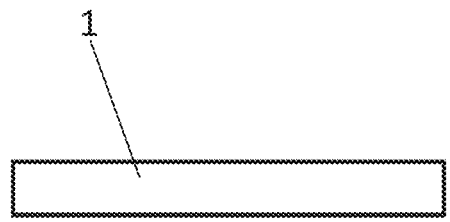
FIGS. 1A to 1D are schematic sectional illustrations of different steps of the method for manufacturing a timepiece according to the invention.

In reference to FIGS. 1A to 1D, the method for manufacturing a timepiece comprises a first step for manufacturing a first part 1 made by a micro-manufacturing or micro-forming method, well known by those skilled in the art, in reference to FIG. 1A, from a first material such as silicon, for example. Said first material may consist of any other material, for example metal, ceramic, plastic, diamond, quartz, glass, silicon carbide or a combination thereof. Furthermore, said first part consists of any timepiece well known by those skilled in the art, such as an escapement wheel, a balance, etc.

Figure 1B:
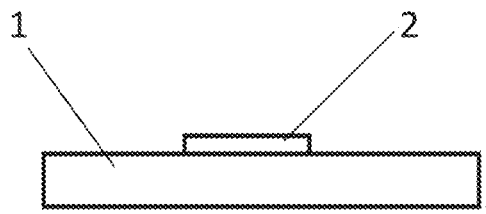
Figure 1C:
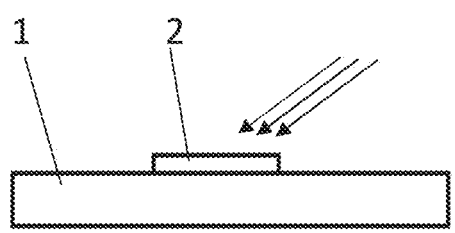
Figure 1D:
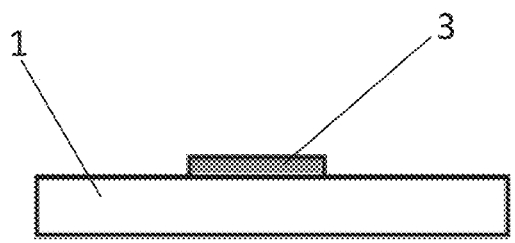

In a second step, in reference to FIG. 1B, a second material 2 is deposited on said first part 1, on all or part of the latter, then in reference to FIG. 1C, a treatment step is carried out on the second material to connect the components of the second part 3 to one another and to connect the second part 3 to the first part 1, and to form a porous second part 3. It will be noted that, depending on the type of treatment applied to obtain the hardening of the second part 3, and outlined in the continuation of the document, the pores of the second part 3 may have a diameter smaller than 2 nanometers (microporosity) or a diameter comprised between 2 and 50 nanometers (mesoporosity) for a diameter greater than 50 nanometers (macroporosity). The second material may consist of any appropriate material such as a metal material comprising silver (Ag) and/or aluminum (Al) and/or gold (Au) and/or titanium (Ti) and/or copper (Cu) and/or nickel (Ni) and/or platinum (Pt) and/or iron (Fe) and/or an oxide thereof and/or at least one polymer, for example.

Figure 2:
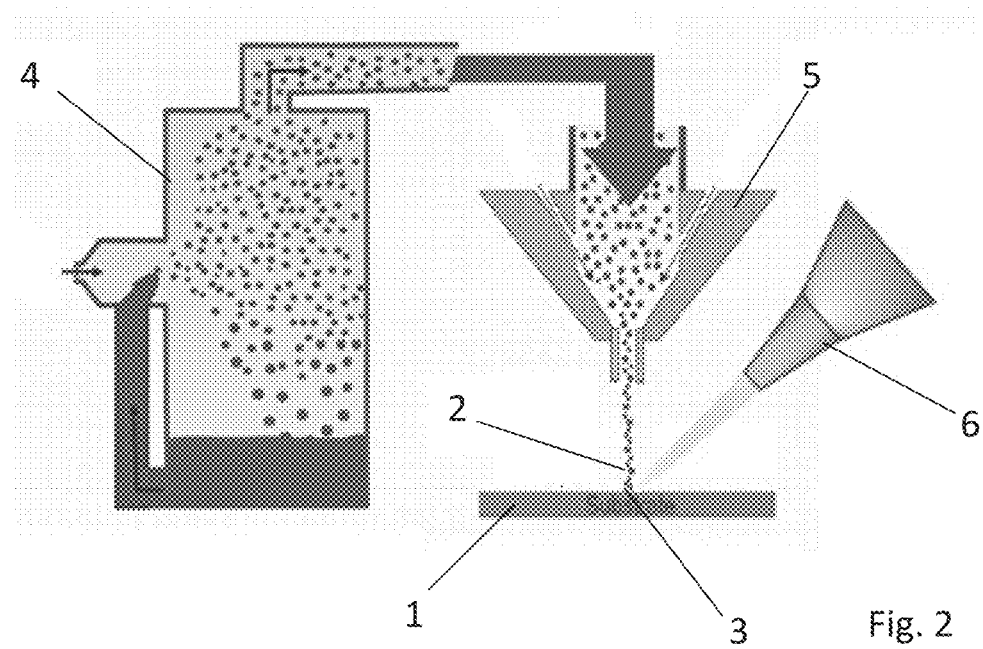
FIG. 2 is a schematic illustration of the embodiment of the method according to the invention by a JP-type printing.

According to a first embodiment, in reference to FIG. 2, the method includes at least the following steps of nebulizing an ink in the form of a solution or suspension of micrometric, submicronic or preferably nanometric particles of at least a second material, said nebulization being done in a so-called nebulization chamber 4, then, using the nozzle 5 connected to the nebulization chamber 4, spraying nebulized ink on the first part 1 of the piece to form said second part 3, and lastly hardening said second part 3 by a heat treatment in a furnace or by localized sintering by a laser 6, for example an infrared laser, on said second part 3. "Hardening" refers to the process of direct or indirect connection of the micrometric, submicronic or nanometric particles to obtain their cohesion.

This method corresponds to the so-called AJP (Aerosol Jet Printing) method, which makes it possible to deposit a very large number of materials, conductive materials to the dielectric materials by passing through the resins, adhesives or semiconductor or biological materials, at the micrometric scale on planar, but also flexible and three-dimensional pieces.

It will be noted that the hardening step by heat treatment in the furnace or by localized sintering by a laser can be replaced by any other treatment step, for example by polymerization. This polymerization consists of photo cross-linking that may be obtained by ultraviolet projection on the second part 3, for example, or chemical cross-linking without going beyond the scope of the invention.

Figure 3:
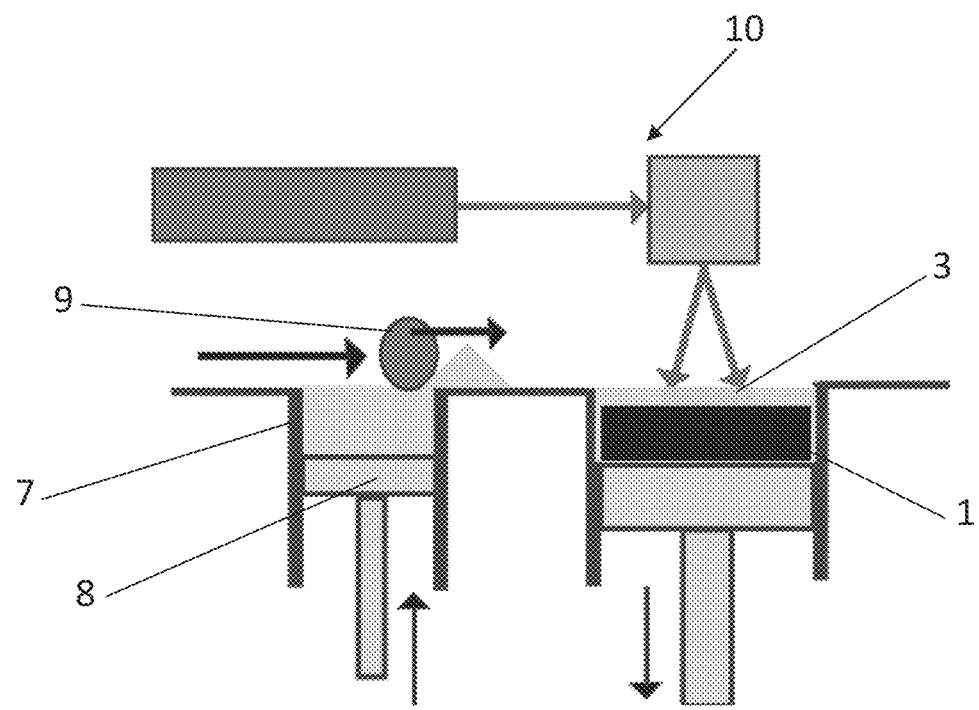
FIG. 3 is a schematic illustration of the embodiment of the method according to the invention by LS- or SLS-type deposition.

According to a second embodiment, in reference to FIG. 3, the method includes at least the following steps for depositing a powder of at least a second material on the first part 1 of the piece, said powder initially contained in a reservoir 7 provided with a piston 8 being deposited on the first part 1 using a roller 9, and a localized sintering step by a power laser 10 on said second part 3, the excess powder being discharged by said roller 9.

This method corresponds to the so-called LS (Laser Sintering) or SLS (Selective Laser Sintering) method, respectively, which allows the use of a very broad range of powders of different materials, including polymers, such as polyether ether ketone (PEEK) and PA12 nylons optionally associated with glass fiber, glass beads or aluminum powder, and/or metals such as steel, titanium, gold, etc. and alloys thereof.

It will be understood that, unlike the methods of the prior art, the method according to the invention does not require a lithography step prior to the deposition of the second material, or a molding step for the added piece, or an assembly step, thereby limiting the manufacturing cost and allowing the production of prototypes and/or small series a low cost.

Furthermore, the method according to the invention allows the production of a second part 3 by depositing successive layers, in a same material or different material, such that said second part has flanks inclined by an angle comprised between 10° and 89°. In this way, it is possible to improve the aerodynamics of the timepiece, but also to optimize the distribution of the masses of said piece.

Said second part 3 forms either a decorative structure or a marking structure, or a functional element, such as an inertial mass or a so-called interfacing element or an organ intended to have a mechanical cooperation function with another piece.

Thus, the method according to the invention makes it possible, in a first application, to print a decorative element, such as a text or design, for example on a timepiece made from silicon, metal, plastic, ceramic (or any other material used in horology). The added material is chosen based on its color relative to the substrate. The use of an additive method according to the invention makes it possible to avoid damaging the piece or to modify the performance of the piece.

Figure 4:
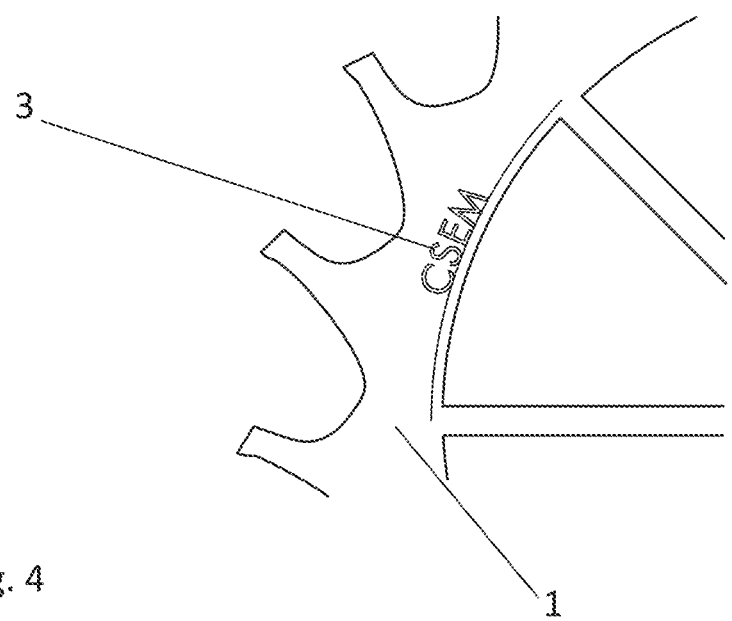
FIG. 4 is a partial top view of an escapement wheel having a marking obtained by the method according to the invention.

In reference to FIG. 4, the second part 3 consists of a decorative element assuming the form of the name CSEM, which is printed on an escapement wheel forming the first part 1.

Furthermore, the second part 3 may consist of an identification element such as a serial number, a barcode, a hologram, etc. on a timepiece made from silicon, metal, plastic, ceramic (or any other material used in horology) from the method according to the invention. Like before, the use of an additive method makes it possible to avoid damaging the piece or to modify the performance of the latter. The printed material is chosen for its contrast with the timepiece, for example gold (Au) for visible identification on a silicon piece.

Figure 5:
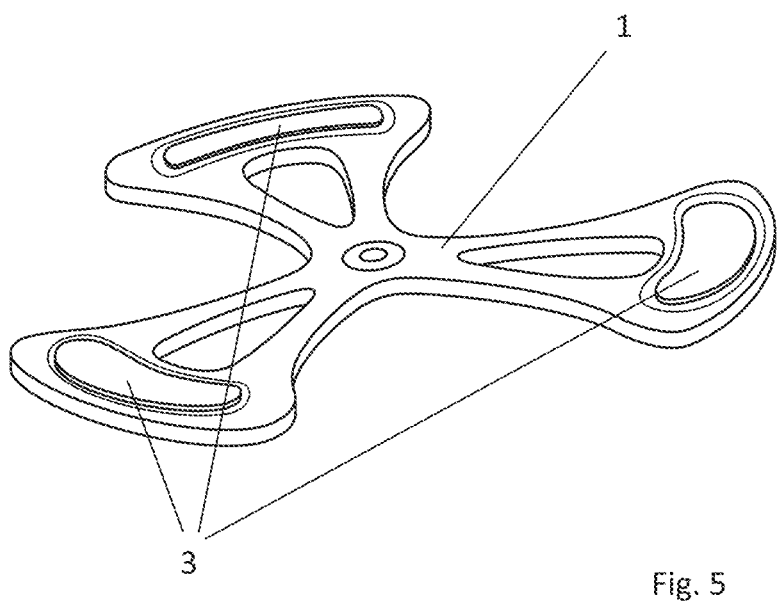
FIG. 5 is a perspective view of a balance including blom studs obtained using the method according to the invention to correct its inertia.

In reference to FIG. 5, the second part 3 may consist of a functional element such as an inertial mass deposited on a balance forming the first part 1. In this way, the second part 3 makes it possible to increase the inertia of a timepiece made from silicon, metal, plastic, ceramic (or any other material used in horology). The material of the second part 3 is chosen relative to its density, for example gold (Au) or platinum (Pt). It will be noted that the method according to the invention, and more particularly the AJP method previously described, procures very good precision and very good reproducibility for producing masses. For example, out of 8 identical depositions, about 0.33 mg was deposited with a standard deviation of 0.03 mg corresponding to the resolution of the microscale used.

Furthermore, the second part 3 may consist of a functional element to correct the inertia of a balance, wheel or any other timepiece requiring a modification of the inertia made from metal, silicon, ceramic, plastic or a combination of these materials. Thus, the second part(s) 3 make it possible to poise a balance having a predefined mass. Secondarily, it is possible to insert, directly on the first part, a measuring system allowing automatic poising of a balance or any timepiece.

In another embodiment, the second part 3 can form an interfacing element. Silicon being brittle, an interfacing element can be printed on a silicon piece or in a material not having a plastic deformation domain. The interfacing material is first deposited on the piece forming the first part 1 on its outer surface or in the driving axis, then an appropriate heat treatment is applied. The axis is next inserted in the piece, only the interface metal undergoing a deformation.

In another embodiment, the second part 3 can form an organ intended to have a mechanical cooperation function with another piece. Said organ may for example consist of a finger or a pinion that is added according to the method on said timepiece.

It will be noted that the thickness of the second parts 3, from about several micrometers to several hundreds of micrometers, may be adapted by One Skilled in the Art based on the nature of the material used for the second parts 3 and the selected application (decorative or functional element) in particular.

Furthermore, although the invention has been described for silicon timepieces, it may be applied to any other materials able to be machined using micro-manufacturing and/or micro-forming techniques without going beyond the scope of the invention.

The invention claimed is:

1. A method for manufacturing a timepiece, comprising:
   micro-manufacturing or micro-forming at least a first part from at least a first material;
   nebulizing an ink in the form of a solution or suspension of micrometric, submicronic or nanometric particles of at least a second material;
   depositing, on said first part, without molding, at least a second part of said piece made from at least the second material, wherein said depositing includes spraying the nebulized ink on the first part of the piece to form said second part; and
   treating the second material to connect the second part to the first part by hardening said second part,
   wherein the first part is a balance; and
   wherein the second material of the second part forms an inertial mass deposited on the balance to correct the inertia of the balance and wherein the second material of the second part is further configured to poise the balance having a predefined mass;
   wherein the second part includes flanks forming an angle between 10° and 89° with the surface on which it is deposited;
   wherein the second part is deposited at the periphery of the balance and extends substantially to the balance plane.

2. The manufacturing method according to claim 1, wherein the hardening step comprises a heat treatment that includes at least one annealing step and/or a localized sintering step.

3. The manufacturing method according to claim 1, wherein the hardening step comprises a polymerization step by photo-cross-linking and/or chemical cross-linking.

4. The manufacturing method according to claim 2, wherein the localized sintering step is obtained by radiation of the second part using a laser.

5. The manufacturing method according to claim 3, wherein the polymerization step by photo-cross-linking is obtained by ultraviolet projection on the second part.

6. The manufacturing method according to claim 1, wherein the material making up the first part of the piece comprises silicon and/or metal and/or ceramic and/or plastic.

7. The manufacturing method according to claim 1, wherein the second part of the piece has a layer or a plurality of layers, each layer being obtained from a material.

8. The manufacturing method according to claim 1, wherein the second part of the piece, or each layer of said second part, is obtained from a material comprising silver (Ag) and/or aluminum (Al) and/or gold (Au) and/or titanium (Ti) and/or copper (Cu) and/or nickel (Ni) and/or platinum (Pt) and/or iron (Fe) and/or one of their oxides and/or at least one polymer.

9. The manufacturing method according to claim 1, wherein the first part comprises a wheel.

* * * * *